(12) United States Patent
Dickey

(10) Patent No.: US 9,673,618 B2
(45) Date of Patent: Jun. 6, 2017

(54) BALANCING PARALLEL SOLID-STATE POWER CONTROLLER CHANNEL CURRENTS SYSTEMS AND METHODS

(71) Applicant: HAMILTON SUNDSTRAND CORPORATION, Charlotte, NC (US)

(72) Inventor: John A. Dickey, Caledonia, IL (US)

(73) Assignee: Hamilton Sundstrand Corporation, Charlotte, NC (US)

(*) Notice: Subject to any disclaimer, the term of this patent is extended or adjusted under 35 U.S.C. 154(b) by 230 days.

(21) Appl. No.: 14/549,796

(22) Filed: Nov. 21, 2014

(65) Prior Publication Data

US 2016/0149400 A1   May 26, 2016

(51) Int. Cl.
| | |
|---|---|
| *H02H 9/04* | (2006.01) |
| *H02J 1/10* | (2006.01) |
| *H03K 17/082* | (2006.01) |
| *H03K 17/12* | (2006.01) |

(52) U.S. Cl.
CPC ............... *H02H 9/04* (2013.01); *H02J 1/10* (2013.01); *H03K 17/0822* (2013.01); *H03K 17/122* (2013.01)

(58) Field of Classification Search
CPC ......... H01H 9/04; H02J 1/10; H03K 17/0822; H03K 17/122
See application file for complete search history.

(56) References Cited

U.S. PATENT DOCUMENTS

| | | | |
|---|---|---|---|
| 5,324,989 A | * | 6/1994 | Thornton ............... H02H 7/30 307/31 |
| 5,804,859 A | | 9/1998 | Takahashi et al. |
| 6,008,549 A | | 12/1999 | Cooper et al. |
| 7,282,899 B1 | | 10/2007 | Daun-Lindberg et al. |
| 7,379,310 B2 | | 5/2008 | Louvel et al. |
| 8,847,656 B1 | | 9/2014 | Ezekial et al. |
| 9,391,059 B2 | | 7/2016 | Dickey |
| 2006/0250742 A1 | | 11/2006 | Fichera |
| 2008/0106152 A1 | | 5/2008 | Maier |
| 2008/0239604 A1 | | 10/2008 | Davison |

(Continued)

FOREIGN PATENT DOCUMENTS

| | | |
|---|---|---|
| EP | 2388917 | 11/2011 |
| EP | 2642608 | 9/2013 |

(Continued)

OTHER PUBLICATIONS

Notice of Allowance dated Mar. 16, 2016 in U.S. Appl. No. 14/464,573.

(Continued)

*Primary Examiner* — Thienvu Tran
*Assistant Examiner* — Tien Mai
(74) *Attorney, Agent, or Firm* — Snell & Wilmer L.L.P.

(57) ABSTRACT

According to various embodiments, a solid-state power controller system is provided with channel protection features. The solid-state power controller system is configured to provide the ability to have sharing control over an individual SSPC channel that is operating in parallel with other SSPC channels. This can assist with the operation of secondary protection, protect the channel from exceeding its own trip curve, as well as assisting with thermal balance between the power dissipation of the channels in the group.

16 Claims, 7 Drawing Sheets

(56) References Cited

U.S. PATENT DOCUMENTS

| | | |
|---|---|---|
| 2008/0259914 A1 | 10/2008 | Simper et al. |
| 2010/0164289 A1 | 7/2010 | Umminger et al. |
| 2010/0164452 A1 | 7/2010 | Ruan et al. |
| 2011/0080115 A1* | 4/2011 | Ge ............... H05B 33/0812 315/294 |
| 2013/0021701 A1 | 1/2013 | Yin et al. |
| 2013/0049462 A1 | 2/2013 | Chen et al. |
| 2013/0051100 A1 | 2/2013 | Daigo et al. |
| 2013/0154717 A1 | 6/2013 | Tyler et al. |
| 2016/0056141 A1 | 2/2016 | Dickey |

FOREIGN PATENT DOCUMENTS

| | | |
|---|---|---|
| EP | 2988418 | 2/2016 |
| WO | 2005015741 | 2/2005 |

OTHER PUBLICATIONS

Extended European Search Report dated Apr. 20, 2016 in European Application No. 15194550.8.
Abdi et al., "Problems associated with parallel performance of high current semiconductor switches and their remedy," International Symposium on Power Electronic, Electrical Devices, Automation and Motion, Speedam 2008, pp. 1379-1383.
Bortis et al., "Active Gate Control for Current Balancing of Parallel-Connected IGBT Modules in Solid-State Modulators," IEEE Transactions on Plasma Science, IEEE Service Center, col. 36, No. 5, Oct. 1, 2008, pp. 2632-2637.
Extended European Search Report dated Jan. 14, 2016 in European Application No. 15181721.0.
Preinterview First Office Action dated Jan. 14, 2016 in U.S. Appl. No. 14/464,573.

* cited by examiner

BALANCING PARALLEL SOLID-STATE POWER CONTROLLER CHANNEL CURRENTS SYSTEMS AND METHODS

FIELD

The present disclosure relates to solid-state power controllers and their components, and more particularly, to balancing parallel solid-state power controller channel currents.

BACKGROUND

Solid-state power controllers ("SSPC") have been designed to have a current channel that can be combined with current channels of other SSPCs to achieve a desired current capacity. However, the individual channels may experience different load conditions, for example, in the event that one or more individual channel fails, or in the event that outrush current demands vary or component values vary. Some channels may become overloaded while other channels may remain within operating specifications. In some instances, this results in possible overloading of one or more circuits, trip coordination complexity, and other factors, such as thermal "hot spots."

SUMMARY

According to various embodiments, a solid-state power controller system is provided with channel protection features. The solid-state power controller system is configured to provide the ability to have sharing control over an individual SSPC channel that is operating in parallel with other SSPC channels. This can assist with the operation of secondary protection, protect the channel from exceeding its own trip curve, as well as assisting with thermal balance between the power dissipation of the channels in the group. Stated another way, the controller in conjunction with the local control functions at channel is configured to direct and/or limit the current over the first channel 3 under a trip curve of its solid-state power controller.

According to various embodiments, a solid-state power controller system is disclosed herein. The solid-state power controller system may include a power source comprising a plurality of output channels comprising a first output channel and a second output channel. The solid-state power controller system may include a first solid-state power controller comprising a first sharing control FET. The first sharing control FET may be coupled in series along the first output channel. The solid-state power controller system may include a second solid-state power controller comprising a second sharing control FET. The second sharing control FET may be coupled in series along the second output channel. The solid-state power controller system may include a controller in electrical communication with the first solid-state power controller and the second solid-state power controller.

According to various embodiments, a method of operating a first solid-state power controller coupled in parallel with a plurality of solid-state power controllers includes sensing the current of a first channel circuit. The first solid-state power controller may be coupled along a first channel circuit. The method of operating a first solid-state power controller coupled in parallel with a plurality of solid-state power controllers may include sensing the current of a plurality of solid-state power controllers along a plurality of individual respective channel circuits. The method of operating a first solid-state power controller coupled in parallel with a plurality of solid-state power controllers may include communicating the sensed current of the first channel current switching circuit to a controller. The method of operating a first solid-state power controller coupled in parallel with a plurality of solid-state power controllers may include providing, by the controller, a control signal directing operation of a gate of a first sharing FET of the first solid-state power controller. The first sharing FET may be coupled in series along a first channel current switching circuit. The operation of the gate of the first sharing FET may be based on an average sensed current of the plurality of individual respective channel circuits or on locally determined limits.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that logical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step.

According to various embodiments, a SSPC system is disclosed herein. More particularly, a SSPC system comprising a SSPC with self-protection features is disclosed herein. Aspects of the designs disclosed herein may be applicable to other power supplies or power sources.

Figure 1:
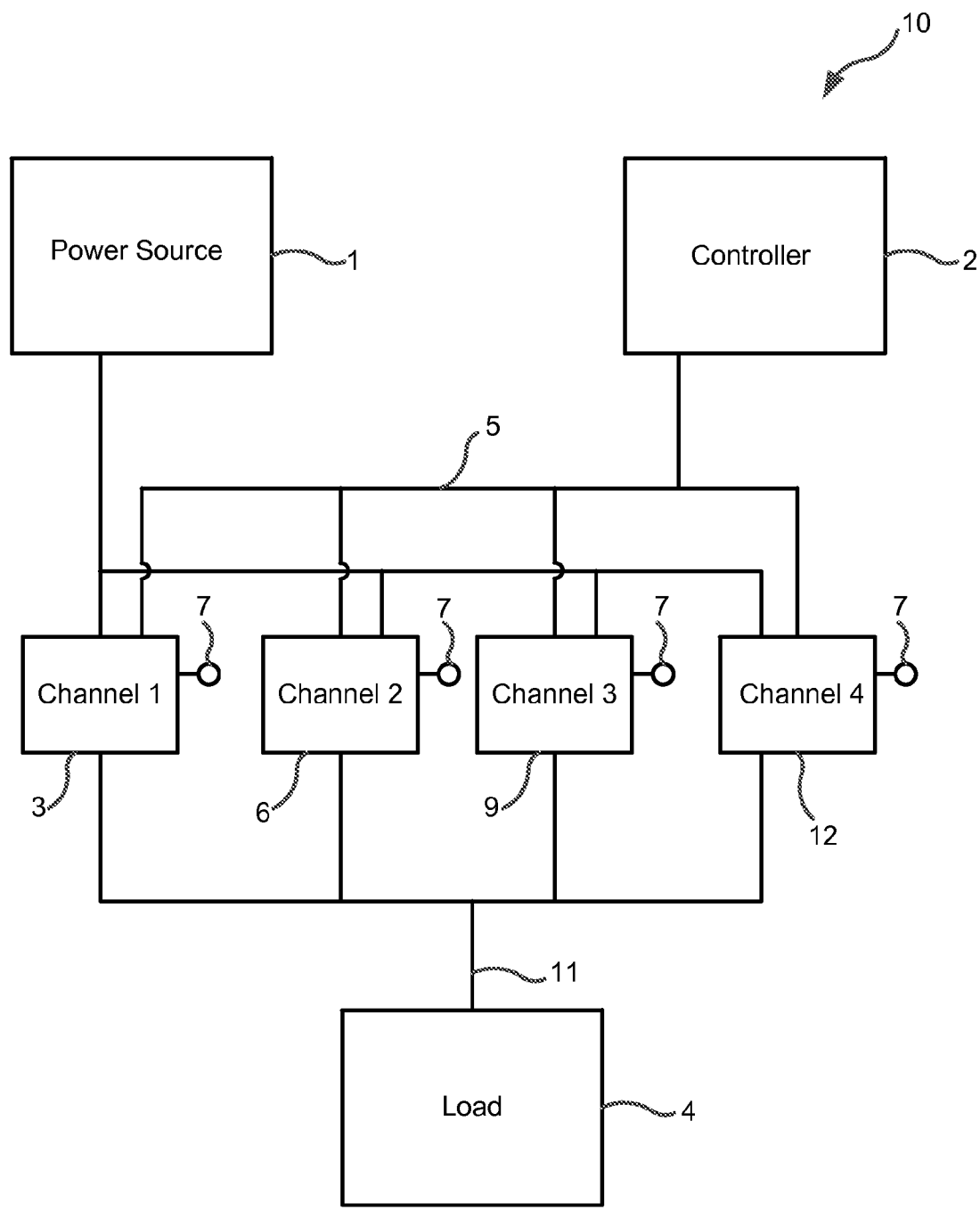
FIG. 1 depicts a SSPC system comprising multiple SSPCs coupled in parallel having individual channels in accordance with various embodiments.

According to various embodiments and with reference to FIG. 1, a SSPC system 10 may comprise a system whereby electrical power is provided for use by a load 4. Moreover, the SSPC system 10 may condition the electrical power so that its current and voltage remains within defined boundaries and may protect itself, and/or the load 4, by preventing the current from unwanted deviations. For instance, the SSPC system 10 may comprise one or more channels, such as channel 1 (3), channel 2 (6), channel 3 (9), channel 4 (12), coupled in parallel whereby the sensed channel voltage output 8 and/or the channel current output 7 may be controlled.

In various embodiments and with continued reference to FIG. 1, the SSPC system 10 may comprise a power source 1, a controller 2, and SSPCs comprising channel 1 (3), channel 2 (6), channel 3 (9), channel 4 (12). The power source 1 may provide electrical power via a channel to one or more SSPC from which it is output at channel current output 7 in response to a control signal 5 comprising directions from controller 2 to the SSPC, and in response to protective actions taken by the SSPC channels both independently and in response to the control signal 5. The top level controller 2 may be configured to direct each channel to a designated current level and each channel individually attempts to follow that instruction. Stated another way, a solid-state power controller system 10 is disclosed herein. The solid-state power controller system 10 may include a power source 1 comprising a plurality of output channels 3, 6, 9, and 12 (also referred to herein as "channels") comprising a first output channel 3 and a second output channel 6. The solid-state power controller system 10 may include a first solid-state power controller 2. A first sharing control FET Q2 may be coupled in series along the first output channel 3 (see FIG. 2). For the sake of convenience, the sharing control FETs Q2 described herein may be referred to herein as Q2. The solid-state power controller system 10 may include a second solid-state power controller. A second Q2 in a second solid-state power controller may be coupled in series along the second output channel 6. The solid-state power controller system 10 may include a controller 2 in electrical communication with the first solid-state power controller and the second solid-state power controller.

With continuing reference to FIG. 1, a SSPC system 10 may comprise one or more SSPCs comprising individual channels, such as channel 1 (3), channel 2 (6), channel 3 (9), channel 4 (12) and/or any number of SSPC channels. Each SSPC may provide electrical power via an individual channel. For example, the first SSPC may provide electrical power via a first channel 3, the second SSPC may provide electrical power via a second channel 6, the third SSPC may provide electrical power via a third channel 9, and the fourth SSPC may provide electrical power via a fourth channel 12. The electrical power may be combined by the various SSPCs. Each SSPC may receive a corresponding control signal 5 from the controller 2. For example, the first SSPC may receive a first control signal, the second SSPC may receive a second control signal, the third SSPC may receive a third control signal, and the fourth SSPC may receive a fourth control signal. By controlling each SSPC, the controller 2 may logically combine SSPCs to control the amount of current drawn from each channel 3, 6, 9, and 12. A bidirectional communications linkage 5, may be configured to allow the controller 2 also to receive information, such as the present current load on a channel from the individual channels, such as the first channel 3, the second channel 6, the third channel 9, and/or the fourth channel 12. The outputs of one or more individual channels may be coupled via a wired linkage 11 to a load 4.

A power source 1 may comprise any apparatus whereby electrical power may be provided. For example, the power source 1 may be a solid-state power supply. The power source 1 may be a linear power supply, or a switching-mode power supply, or a power supply operating according to a variety of different modes. The power source 1 may further comprise a generator, an alternator, a fuel cell, or another source of electrical energy and in various embodiments may be configured for aircraft use. For example, the power source 1 may comprise a generator mechanically connected with a turbine engine, such as an aircraft engine or an aircraft auxiliary power unit engine. Although, scalable SSPC systems 10 disclosed herein involve power sources 1 that provide direct current, in further embodiments, a power source 1 may provide an alternating current, or may provide any form of electrical power.

In various embodiments, the scalable SSPC system 10 may comprise a controller 2. The controller 2 may comprise a digital controller, an analog controller, or may comprise a combination of digital and analog components. The controller 2 may comprise a logical division of one or more of an aircraft data bus, a remote data concentrator, a flight computer, a full authority digital engine control ("FADEC"), an electronic engine controller ("EEC"), an engine control unit ("ECU"), and/or any other aircraft system. The controller 2 may comprise a processor and a tangible, non-transitory memory, as well as a digital-to-analog converter ("DAC"), an analog to digital converter ("ADC"), and/or discrete logic components, for example, TTL and/or CMOS level logic devices. The controller 2 provides a control signal 5 to the SSPC as discussed further herein. For example, the controller 2 may provide a first control signal to the first SSPC a second control signal to the second SSPC, a third control signal to the third SSPC, a fourth control signal to the fourth SSPC, and/or any number of control signals 5 to any number of SSPC.

The SSPC system 10 may comprise one or more SSPCs. A SSPC may comprise analog components and/or digital components configured to limit the current and/or voltage output from the power source 1 to the output. According to various embodiments, the SSPC system 10 may comprise a plurality of SSPCs, the SSPCs may be directed by the controller 2 to balance the total current provided among different channels of the power source 1.

In conventional SSPC systems, in response to multiple SSPC channels being connected in parallel to form a larger channel 'group,' due to a number of factors, the channels generally will not all carry the same percentage of the load current. As previously mentioned, this may result in possible overloading of one or more circuits, trip coordination complexity, and other factors, such as thermal "hot spots." Previous SSPC systems designs to combat these concerns depended on at least partially matching field effect transistor ("FET") values and/or matched trace line lengths to naturally approximately balance in the current loading between channels.

Balancing parallel currents during turn off using a sharing FET coupled in parallel with a balancing resistor has been postulated. In this scenario, a FET was turned ON during normal operation and OFF when the channel was OFF, thus driving any inductive clamping currents through a balancing resistor. This approach by itself, however; did not provide any balancing of channels during normal ON operation.

Figure 2:
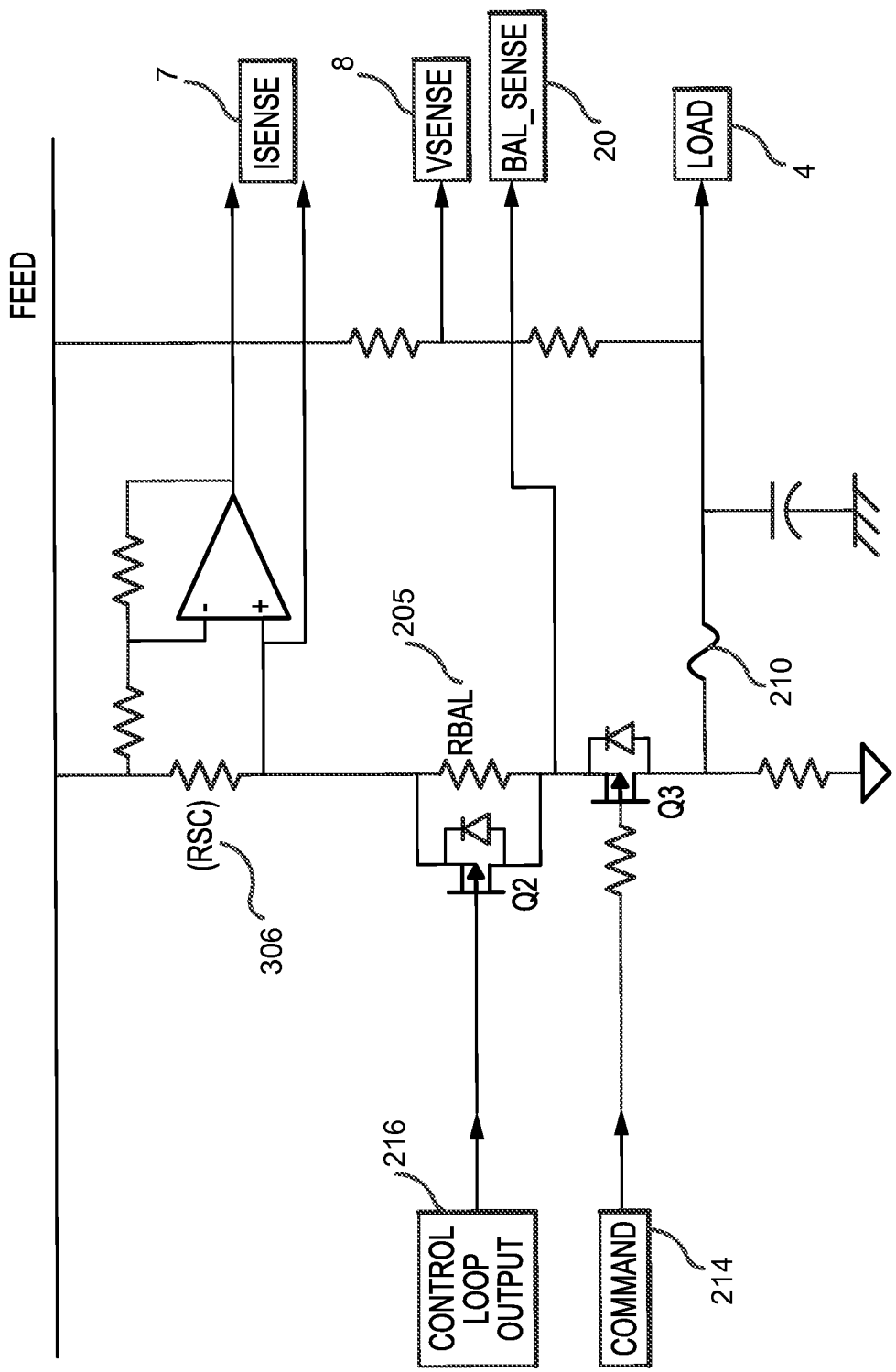
FIG. 2 depicts an example channel of a SSPC comprising a sharing FET and balance resistor with optional current limiting in accordance with various embodiments.

According to various embodiments, the systems and designs disclosed herein provide enhancements to these previous approaches and provide additional means to adjust the balanced sharing of load current between parallel connected channels during normal operation as well as during startup inrush and turn off inductive clamping. With reference to FIG. 2, a series coupled Q2 is disposed on each channel, such as channel 3, along with an analog and/or digital control loop configured to drive the gate of Q2 to follow a control algorithm. Stated another way, the controller 2 directs the operation of a gate of Q2 and a gate of a second sharing control FET (for example in another channel) via a control algorithm. The control algorithm can be one of a variety of schemes including one programmed to direct matching of currents (based on exchange of total or average current of the other parallel channels) or for example act as a limiter to direct a parallel channel not to exceed a locally controlled current and/or time-current curve. Stated another way, the control algorithm may be configured to direct current matching between the first channel 3 and a second channel 6. According to various embodiments, the control algorithm is configured to utilize the average current of a first current measured over the first channel 3 and a second current measured over the second channel 6 to direct current matching between the first channel 3 and the second channel 6.

According to various embodiments, the control algorithm may be configured to utilize the total sum of current of a first current measured over the first channel 3 and a second current measured over the second channel 6 to direct current matching between the first output channel, the second output channel and/or any desired number of additional coupled channels. The control algorithm may be configured to limit current over the first channel 3 by at least one of a time-current curve or a locally controlled current.

FIG. 2 depicts the general topology of the circuit function with the sharing FET Q2 controlled by a control loop during normal ON operation and ON/OFF during startup and shutdown and SSPC OFF state. While FIG. 2 depicts a represented channel 3, it should be appreciated that channels 6, 9, and 12 may comprise similar and/or equivalent topologies. The transistors, Q2, may be operated in the linear region (also known as the ohmic or Triode mode). In this manner, the resistivity of the source-drain conduction path may be varied; however, under some circuit conditions, one or more transistors may be operated in the active, or saturated, region, such as when maximum current is desired to be supplied. Each transistor may be a p-channel FET, or an n-channel FET. Alternatively, other transistors such as bipolar junction transistors ("BJTs"), whether NPN or PNP, may be implemented, or other voltage-controlled switches or other current-controlled switches may be implemented.

According to various embodiments, the control loop may be configured to leave Q2 OFF in response to the SSPC first turning ON to direct maximum sharing control for inrush currents through the balancing resistor. A control loop algorithm will then turn ON Q2 and operate Q2 in the linear region once the current has approximately reached steady state.

Q2 may operate such that the channel 3 operates near but out of saturation to provide a controlled adjustment of up to several milli-ohms during normal ON operation of the channel 3. The areas of operation for a transistor switch are known as the "saturation region", the "active or linear region", and the "cut-off region". Thus, the transistor may be operated as a switch by driving it back and forth between its "fully-OFF" (cut-off) and "fully-ON" (saturation) regions. In response to the channel 3 turning OFF, Q2 may be toggled to the fully-OFF configuration at substantially the same time as Q3 to direct maximum sharing control through the balance resistor 205 during inductive clamping. During the normally ON state of the channel 3, Q2 may be controlled to limit the maximum current the channel will draw and/or can coordinate with the other channels in the group so as to direct all the channels in the group, such as channels 3, 6, 9, and 12 as shown in FIG. 1, to each carry substantially the same amount of current.

According to various embodiments, the SSPC system 10 disclosed herein provides the ability to provide sharing control over an individual SSPC channel 3 that is operating in parallel with other SSPC channels, channels 6, 9, and 12, such as the system depicted in FIG. 1. This functionality may facilitate local SSPC channel 3 current coordination with a local secondary protection, see fuse 210, to assist the channel 3 so that a trip curve is not exceeded, and/or assist with maintaining thermal balance between the power dissipation of the channels in the group, such as channels 3, 6, 9, and 12 coupled in parallel.

According to various embodiments, the SSPC system 10 may be configured to address at least 4 different operational scenarios: inductive clamping, capacitive in-rush, a passive limiter approach control loop, and then the fully active control loop.

Figure 3:
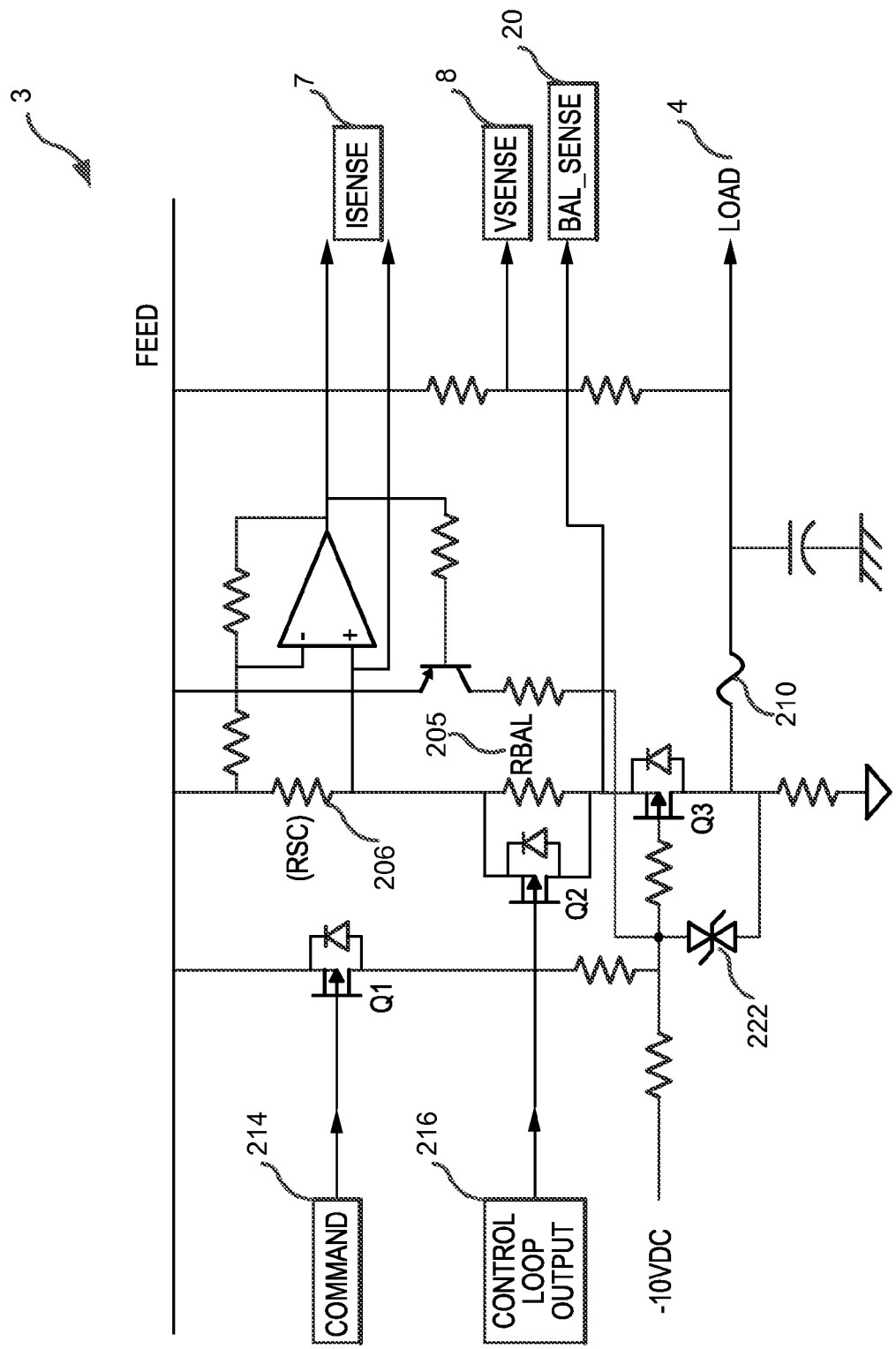
FIG. 3 depicts an example channel of a SSPC comprising a sharing FET and balance resistor and secondary protection element with optional current limiting in accordance with various embodiments.

In the case of an inductive load and with continued reference to FIG. 3, in response to Q3 being in a Fully-Off state, Q2 is turned OFF. Operation of the gate of Q3 may be directed by a command signal 214. In response to the inductive load being in a Fully-Off state, the load voltage is negative until a transient voltage suppressor (Transorb), such as a bidirectional transorb 222, coupled to the gate of Q3 starts to conduct. A transient voltage suppressor (Transorb) is a Zener diode that is engineered for high power operation. Some transorbs are "bidirectional." In other words, they may comprise two Zener diodes in one package. Tranzorb 222 may be configured to trigger Q3 to conduct in response to a lightning event and during an inductive turn-off clamping event. For instance, as the bidirectional transorb 222 turns on, when Q2 is OFF, current is conducted through Q3 and through balance resistor 205 ("R balance"). In response to channel 3 coupled in parallel with other channels 6, 9, and 12 carrying more current, voltage drop across balance resistor 205 on channel 3 and that is directed back to the other channels 6, 9, and 12 which forces the other channels 6, 9, and 12 to carry more current. Stated another way, the voltage drop across balance resistor 205 acts to modify the gate voltage of the transistors of the other channels 6, 9, and 12. According to various embodiments, a Zener diodes coupled to a reverse polarity blocking diode may be implemented such that the voltage from Q1 is not bled off by the load. According to various embodiments, the current and/or voltage output of the channel 3, is essentially transformed into the equivalent of a power Zener diode that's set at a voltage below the rating of the main power, such as about 10% below the rating of the main power, so that the voltage rating is not exceeded. Back EMF is provided. As back EMF is provided, the flux in a relay coil is collapsed.

According to various embodiments, the capacitive in-rush scenario is where the channel is OFF. Q2 is turned off in response to Q3 being turned on. In response to channel 3 coupled in parallel with other channels 6, 9, and 12 carrying more current, the voltage drop across R balance 205 on channel 3 forces the other channels 6, 9, and 12 to carry more current. Stated another way, the voltage drop across R balance 205 acts to modify the gate voltage of the transistors of the other channels 6, 9, and 12. In this way, if one channel is carrying more current than desired, the other channels may become more active and help to balance the in-rush current. Once the current in-rush has reached a steady state, then Q2 is turned ON thus bypassing R balance 205 and minimizing power dissipation for steady state operation.

In the in-rush scenario, channel 3 is operating in the linear range when the inrush is high enough to force significant drop across balance resistor R205. Otherwise, channel 3 is operating in the saturated state after being turned on. In other words, in response to a gate threshold variation from one channel to another, the source impedance may be utilized to draw more current. A source impedance may be configured to pinch the channel OFF and act as a current limiter for that channel. The drain-source voltage above which the drain current becomes constant is known as a pinch OFF voltage. A low source impedance with a wide variation in currents will result in no feedback limit. Thus, the source resistance may provide substantial feedback so one device (e.g., a first SSPC) may carry 3 or 4 times as much current as another device (e.g., a second parallel coupled SSPC). A substantial voltage drop across that source resistance will result, which counteracts a gate threshold variation for that device. The device may compensate for the voltage drop and force a portion of the current back to the other channels that are carrying less.

According to various embodiments, the SSPC system 10 may be configured to act as an active limiter during steady state operation. For instance, in response to the total resistance through channel 3 being lower than the other channels 6, 9, and 12 and more than the rated current is being drawn for channel 3, then gate voltage of Q2 is adjusted so that that channel 3 current does not exceed its rating. A limit may be placed on the authority of the control adjustment so that Q2 is not driven to the point of damage.

Thus, a two level control loop may be created. A local control loop configured to limit the authority or takes the average or total current from the upstream controller and track to average or total current level. Then an upstream controller, (e.g., controller 2) may take the input from multiple channels and to determine the set point where all of the channels should be operating. In this context, upstream may refer to occurring prior to in this context.

For instance, in the scenario where an undesired amount of current is present through Q3, such as at or near a fuse trip rating (fuse 210), reliability may be degraded. The control loop may be configured to adjust Q2 so that the Q3 current does not exceed the channel rating plus some small margin to allow for tolerance stackups in the control loop. In various embodiments, the gate voltage of the Q2 may be changed by the controller 2, via a control signal 5 and the control loop output 216.

For example, in the case of a 5 amp SSPC with three channels coupled in parallel where the first channel is carrying 5.2 amps and the second channel is carrying 4.5, and the third channel is carrying 4.8 amps, the resistance of Q2 on the first channel may be increased slightly such that the 5.2 amps is reduced down to 5 amps thus driving the other 0.2 A through one or both of the other 2 channels. This may result in separation from the trip curve point for a fuse 210 on the channel. In this way, the channel design, primarily at Q2, and control loop architecture is operating as a limiter for the current in the channel.

According to various embodiments, lightning events may be accounted for, such as via the transorb 222 on the Q3 gate. For instance, in response to a lightning event, whether Q2 is ON, the lightning current will go through the balance resistor 205 and Q3. In this way, secondary local protection working within SSPC system 10 is achieved. When Q3 is OFF, current may flows once the voltage drop between the feed power source 1 and the load 4 has reached the level where tranzorb 222 begins to conduct and turns Q3 on into the linear region. Lightning current will go through the balance resistor 205 and Q3. In this way, secondary local protection working within SSPC system 10 is achieved.

According to various embodiments, a fourth sequence includes controller 2 being configured not turn on channel 3 alone when channel 3 is in a parallel group. Controller 2 may be configured to command all the channels in the parallel group on together at or close to the same time and then once on, the current balancing described herein begins. Controller 2 is configured to read all the current sensed from the plurality channels, channels 3, 6, 9, and 12, that are tied in parallel and averages their measured current. The upstream controller 2 is configured to send a set point command to all the channels, channels 3, 6, 9, and 12, to direct the plurality of channels, channels 3, 6, 9, and 12, to drive each channel, channels 3, 6, 9, and 12, to a desired amount of current. The current may be sensed via the use of a current sense resistor (RSC) 206. If a channel is driving to more than the desired amount of current, then Q2 gate is adjusted to bring that channel down to match the set point. The control loop is configured to direct the channels, 3, 6, 9, and 12, all up to substantially equal or the same total current.

According to various embodiments, a true tracking control loop may be employed. Stated another way, the Q2s on the channels, channels 3, 6, 9, and 12 may be adjusted such that so that all the channels carry substantially the same current. Additional upstream coordination from controller 2 may be utilized for this operational mode. For instance, a controller that adds up or averages the sensed currents for the parallel channels and transmits that value into the control loop as an input parameter via a control signal 5 may be employed as additional upstream coordination.

Current readings are made locally and sent to controller 2 for summing. However, it is possible for one channel to be overcurrent while the aggregate parallel group of channels is not. This is when the local channel has to place Q2 in the linear mode and limit the current through that channel so that some of the other channels take up the extra load. Stated another way, according to various embodiments, Q2 becomes active if the channel starts to exceed its current rating.

FIGS. 2 and 3 depict one main FET Q3 in a single channel, such as for example channel 3. In the case of additional main FETs Q3, additional FETs Q2 may be added and/or one Q2 may be coupled between multiple Q3s when the Q3's are in the same local channel and well matched in layout characteristics. According to various embodiments, a voltage sense point 20 may be located between Q2 and Q3. The readout of the voltage set point may be fed to the control loop to help determine whether Q2 is adjusted to a desired level and/or whether it is being overloaded.

Figure 4A:
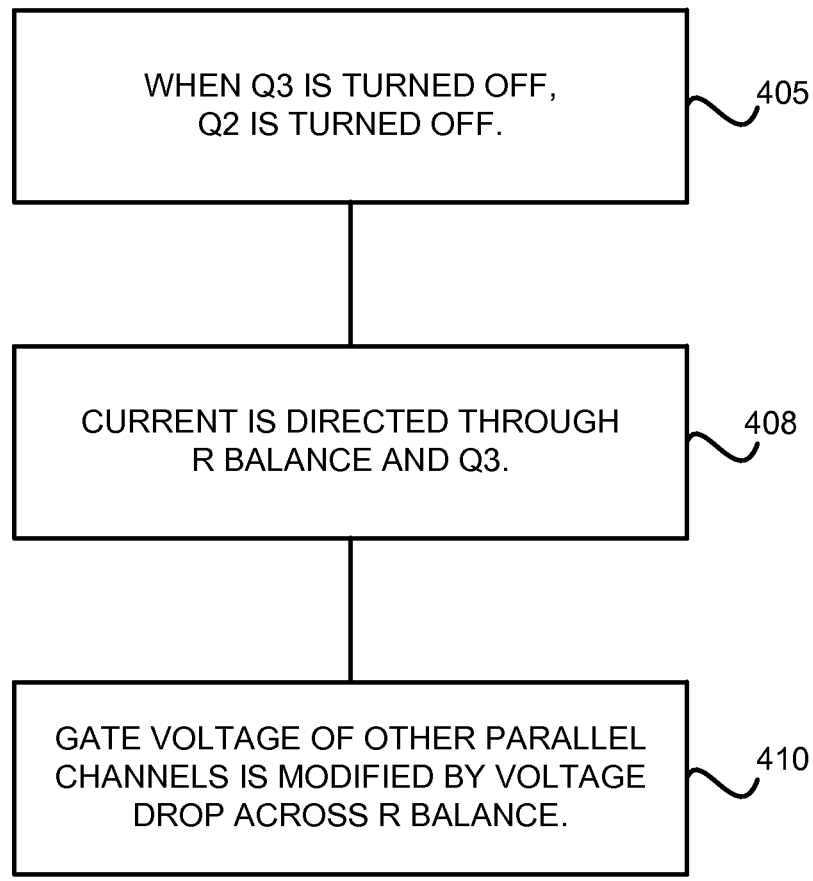
FIGS. 4A-4D depict operational flow chart of a SSPC system in accordance with various embodiments.

According to various embodiments and with reference to FIG. 4A, an inductive load scenario is depicted. In response to Q3 being turned OFF, Q2 is turned OFF. (Step 405). Current is directed through R Balance 205 and Q3. (Step 408). The gate voltage of the other parallel coupled channels is modified by the voltage drop across R Balance 205 (Step 410). Stated another way, when the inductive load is turned off, the load voltage trends negative until transorb 222 begins conducting. As transorb 222 begins conducting, when Q2 is OFF, transorb 222 effectively pulls current through Q3 and through R balance 205. In the case of multiple parallel channels, if one of the channels is carrying more current, a greater drop to across R balance 205 will be measured on that channel which forces the other parallel coupled channels to carry more current. This essentially modifies the other channels gate voltages.

Figure 4B:
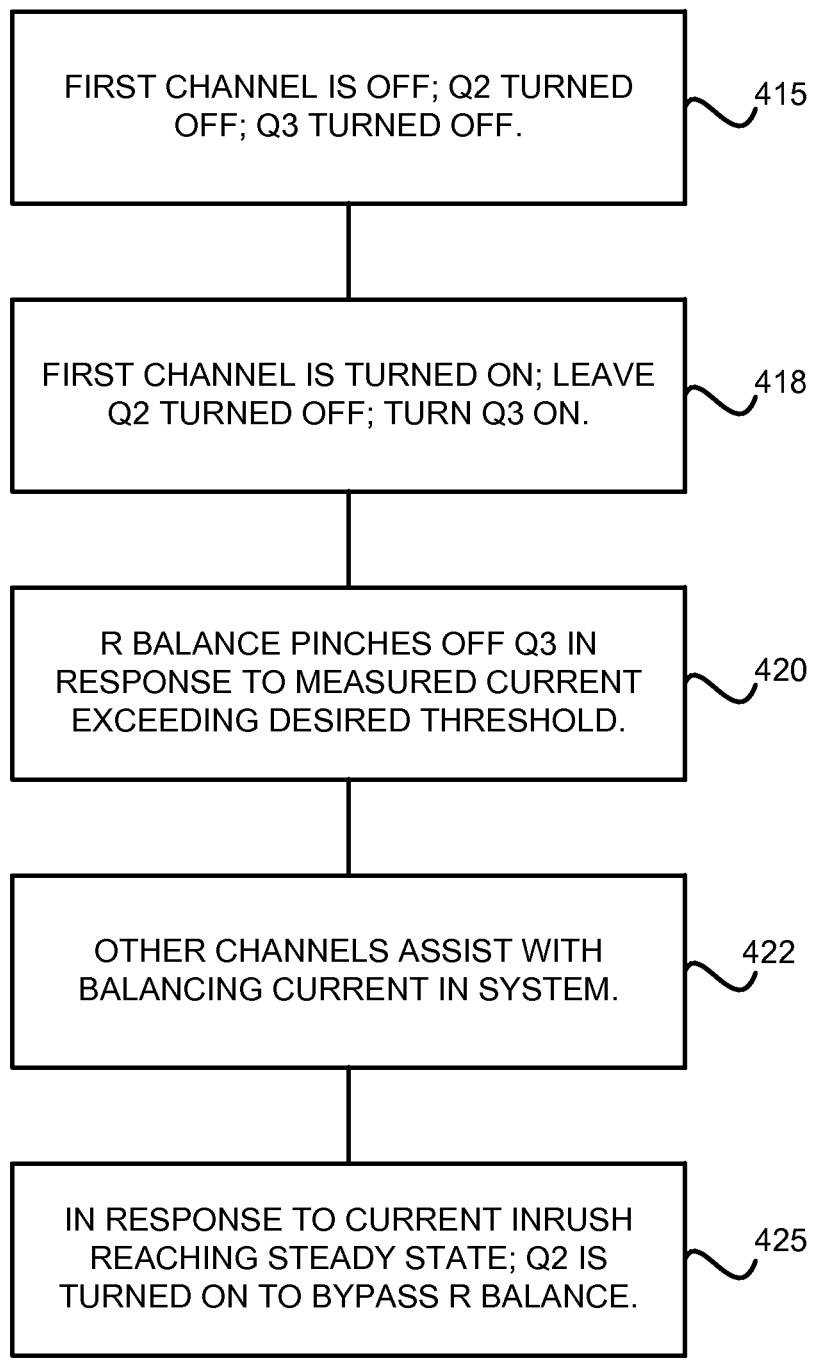

According to various embodiments and with reference to FIG. 4B, a current in-rush scenario is depicted. Initially, the first channel is OFF, Q3 is OFF, and the Q2 is OFF (Step 415). In response to the plurality of coupled channels being turned ON, Q2 is left turned OFF while Q3 is turned ON (Step 418). R balance 205 pinches OFF Q3 in response to measured current exceeding a desired threshold (Step 420). The other channels coupled in parallel assist with balancing current among the channels in the system (Step 422). In response to current in-rush reaching steady state, Q2 is turned ON to bypass R balance 205 (Step 425). Stated another way, Q2 is in an OFF state while the first solid-state power controller is togged to an ON state and directs sharing control for inrush currents through the balancing resistor 205. A control loop algorithm may be configured to toggle Q2 to an ON status and operate Q2 in a linear region during normal ON operation of the first solid-state power controller.

Figure 4C:
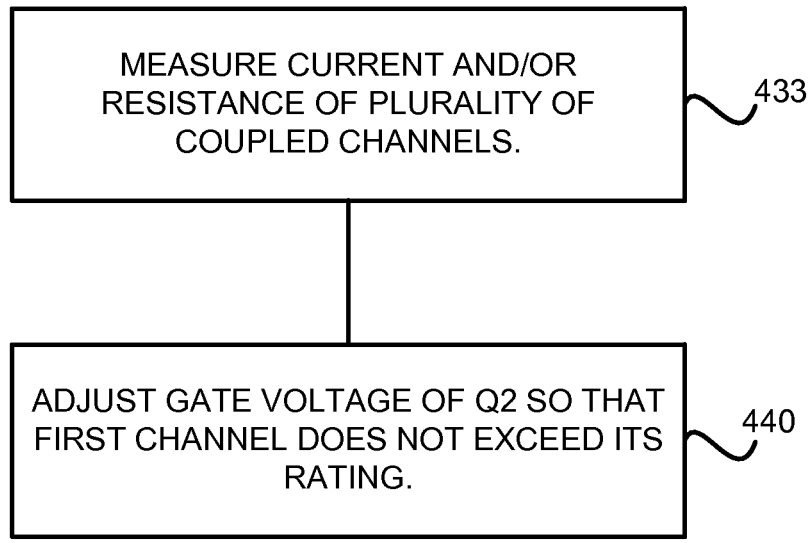

According to various embodiments and with reference to FIG. 4C, an active limiter scenario is described. The resistance and/or current through the plurality of parallel channels is individually measured (Step 433). The measurements are transmitted to the controller 2. The gate voltage of Q2 is adjusted via control signals sent to Q2 so that the first channel does not exceed its rating (Step 440).

Figure 4D:
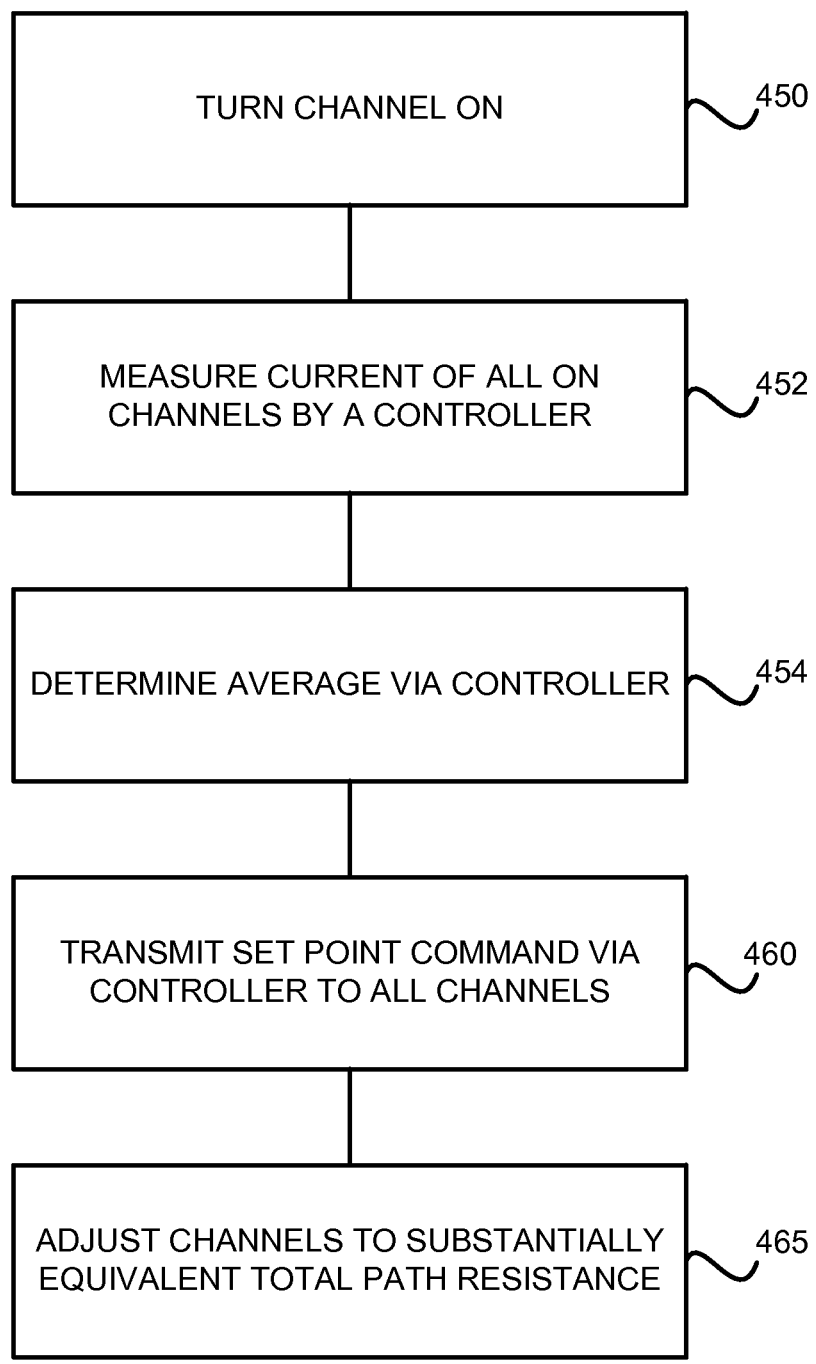

According to various embodiments and with reference to FIG. 4D, a plurality of coupled channels turned ON (Step 450). The resistance and/or current through the plurality of parallel channels is measured and transmitted to a controller 2 (Step 452). An average and/or total current is determined by the controller 2 (Step 454). A set point command is transmitted via the controller and a control signal to all channels (Step 460). The total path resistance of the channels is adjusted to a substantially equivalent value (step 465).

While the systems described herein have been described in the context of SSPC systems for implementation in aircraft applications; however, one will appreciate in light of the present disclosure, that the systems described herein may be used in various other applications, for example, different vehicles, different power applications, and different circuit protection arrangements, or any other vehicle or device, or in connection with industrial processes, or propulsion systems, or any other system or process having need for a power supply with channel protection.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A solid-state power controller system comprising:
    a power source comprising a plurality of output channels comprising a first output channel and a second output channel;
    a first solid-state power controller comprising a first sharing control FET, wherein the first sharing control FET is coupled in series along the first output channel;
    a second solid-state power controller comprising a second sharing control FET, wherein the second sharing control FET is coupled in series along the second output channel; and
    a controller in electrical communication with the first solid-state power controller and the second solid-state power controller;
    a sense resistor coupled in series with the first output channel; and
    a balance resistor coupled in parallel with the first sharing control FET,
    wherein the controller directs the operation of a gate of the first sharing control FET and a gate of the second sharing control FET via one or more control algorithms,
    the first sharing FET is configured to be in an OFF state while the first solid-state power controller is toggled to an ON state and directs sharing control for in-rush currents through the balance resistor, and
    a control loop algorithm configured to toggle the first sharing FET to an ON status and operate the first sharing FET in a linear region during normal ON operation of the first solid-state power controller.

2. The solid-state power controller system according to claim 1, wherein the control algorithm is configured to direct current matching between the first output channel and the second output channel.

3. The solid-state power controller system according to claim 2, wherein the control algorithm is configured to utilize the average current of a first current measured over the first output channel and a second current measured over the second output channel to direct current matching between the first output channel and the second output channel.

4. The solid-state power controller system according to claim 2, wherein the control algorithm is configured to utilize the total sum of current of a first current measured over the first output channel and a second current measured over the second output channel to direct current matching between the first output channel and the second output channel.

5. The solid-state power controller system according to claim 1, wherein the control algorithm is configured to limit current over the first output channel by at least one of a time-current curve or a locally controlled current.

6. The solid-state power controller system according to claim 1, wherein in response to the first output channel being switched from an ON state to an OFF state, the first sharing FET is turned fully OFF to force sharing control through the balance resistor during inductive clamping.

7. The solid-state power controller system according to claim 1, wherein the controller is configured to assist with managing thermal balance between power dissipation of the first output channel and the second output channel.

8. The solid-state power controller system according to claim 1, wherein the controller is configured to limit the current over the first output channel under a trip curve of the first solid-state power controller.

9. A method of operating a first solid-state power controller coupled in parallel with a plurality of solid-state power controllers comprising:
sensing the current of a plurality of solid-state power controllers along a plurality of individual respective output channels;
communicating the sensed current of the plurality of the solid-state power controllers to a controller; and
providing, by the controller, a control signal of at least one of an average current command or a total current command to a local controller on individual respective output channels locally controlling the operation of a sharing gate of a FET, wherein the voltage drop across a balance resistor is measured to determine the occurrence of an overstressed condition, the balance resistor coupled in parallel with the FET.

10. The method of operating the first solid-state power controller coupled in parallel with the plurality of solid-state power controllers according to claim 9, wherein the plurality of individual respective output channels comprise respective sharing FETs.

11. The method of operating the first solid-state power controller coupled in parallel with the plurality of solid-state power controllers according to claim 10, wherein the plurality of individual respective output channels comprise a corresponding balance resistor coupled in parallel with the respective sharing FETs.

12. A solid-state power controller system comprising:
a power source comprising a plurality of output channels comprising a first output channel and a second output channel;
a first solid-state power controller comprising a first sharing control FET, wherein the first sharing control FET is coupled in series along the first output channel;
a second solid-state power controller comprising a second sharing control FET, wherein the second sharing control FET is coupled in series along the second output channel; and
a controller in electrical communication with the first solid-state power controller and the second solid-state power controller;
a sense resistor coupled in series with the first output channel; and
a balance resistor coupled in parallel with the first sharing control FET,
wherein the controller directs the operation of a gate of the first sharing control FET and a gate of the second sharing control FET via one or more control algorithms.

13. The solid-state power controller system according to claim 12, wherein the first solid-state power controller comprises an additional FET coupled in series with the first sharing control FET.

14. The solid-state power controller system according to claim 13, wherein in response to an inductive load scenario, the first sharing control FET is configured to be turned OFF in response to the additional FET being turned OFF.

15. The solid-state power controller system according to claim 14, wherein in response to the first sharing control FET being turned OFF and the additional FET being turned OFF, a current is directed through the balance resistor and the additional FET.

16. The solid-state power controller system according to claim 15, wherein the controller is configured to modify a gate voltage of the second sharing control FET according to the voltage drop across the balance resistor.

* * * * *